(12) United States Patent
Rizzo et al.

(10) Patent No.: US 7,679,945 B2
(45) Date of Patent: Mar. 16, 2010

(54) PERSISTENT VOLATILE MEMORY WITH SENSE AMPLIFIER AND DISCHARGE SWITCH

(75) Inventors: Pierre Rizzo, Aix en Provence (FR); Christophe Moreaux, Simiane (FR); David Naura, Aix en Provence (FR); Ahmed Kari, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 162 days.

(21) Appl. No.: 12/043,766

(22) Filed: Mar. 6, 2008

(65) Prior Publication Data
US 2008/0212360 A1    Sep. 4, 2008

Related U.S. Application Data

(63) Continuation-in-part of application No. PCT/FR2006/002036, filed on Sep. 5, 2006.

(30) Foreign Application Priority Data
Sep. 8, 2005    (FR)    .................................... 05 09141

(51) Int. Cl.
*G11C 11/24* (2006.01)
(52) U.S. Cl. .................. 365/149; 365/204; 365/218
(58) Field of Classification Search .................. None
See application file for complete search history.

(56) References Cited

U.S. PATENT DOCUMENTS

| | | | | |
|---|---|---|---|---|
| 3,713,148 | A * | 1/1973 | Cardullo et al. | ................ 342/42 |
| 4,982,363 | A | 1/1991 | Sood | ..................... 365/189.01 |
| 5,623,442 | A | 4/1997 | Gotou et al. | ........... 365/185.08 |
| 5,706,225 | A | 1/1998 | Buchenrieder et al. | ...... 365/102 |
| 6,906,946 | B2 * | 6/2005 | Issa | ............................. 365/149 |
| 2001/0028575 | A1 | 10/2001 | Ang et al. | .................... 365/154 |
| 2002/0005536 | A1 | 1/2002 | Schindler et al. | ............ 257/296 |
| 2005/0180222 | A1 * | 8/2005 | Suzuki | .................. 365/189.05 |

* cited by examiner

*Primary Examiner*—Mark A Robinson
*Assistant Examiner*—James G Norman
(74) *Attorney, Agent, or Firm*—Lisa K. Jorgenson; Robert Iannucci; Seed IP Law Group PLLC

(57) ABSTRACT

A persistent volatile memory cell memorizes a binary datum during a retention time independent from a supply voltage of the memory cell. The memory cell comprises a capacitive memory point supplying a persistent voltage and having a determined discharge time, a switch for triggering the discharge of the memory point when an erase signal has an active value, a switch for triggering the charge of the memory point when a write signal has an active value, and a sense-amplifier circuit having an input receiving the persistent voltage, and an output supplying the binary datum. The memory cell can be applied to the management of an inventory flag in a contactless integrated circuit.

24 Claims, 5 Drawing Sheets

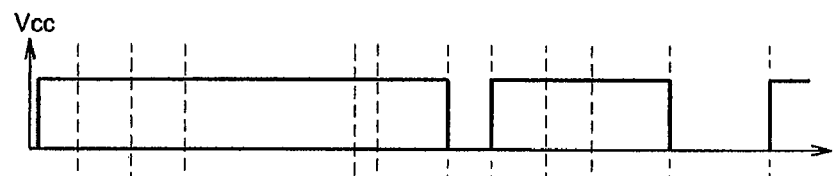
FIG. 8A
FIG. 8B
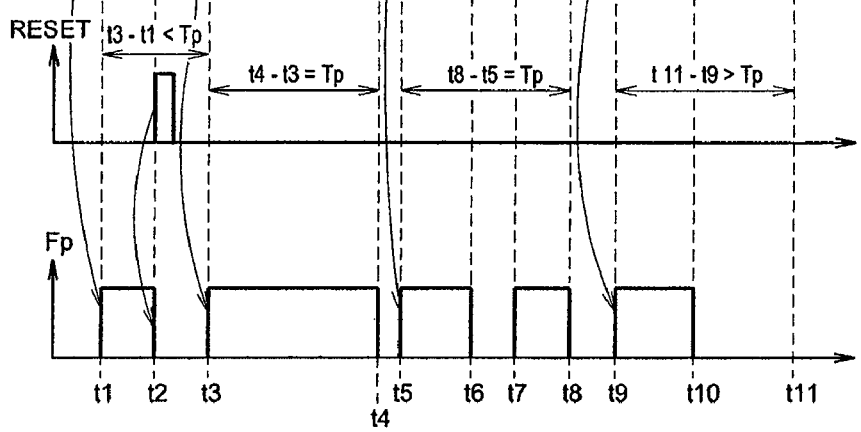
FIG. 8C
FIG. 8D

PERSISTENT VOLATILE MEMORY WITH SENSE AMPLIFIER AND DISCHARGE SWITCH

CROSS-REFERENCE TO RELATED APPLICATION

This application is a continuation-in-part of International Patent Application No. PCT/FR2006/002036, filed Sep. 5, 2006, now pending, which application is incorporated herein by reference in its entirety.

This application claims the benefit under 35 U.S.C. §119 (a) of French Patent Application No. 05 09141, filed Sep. 8, 2005, which application is incorporated herein by reference in its entirety.

BACKGROUND

1. Technical Field

The present invention relates to a persistent volatile memory cell, for memorizing a binary datum during a retention time independent from a supply voltage of the memory cell.

2. Description of the Related Art

Electronic circuits usually comprise two types of memory cells: the volatile memory cells, used for making registers or memory arrays of the type RAM (Random Access Memory), and the non-volatile memory cells, used for making registers or memory arrays of the types ROM (Read Only Memory), EPROM (Electrically Programmable Read Only Memory), EEPROM (Electrically Erasable and Programmable Read Only Memory), Flash, etc.

A datum stored in a volatile memory cell is irremediably lost when the supply voltage of the memory cell disappears. Conversely, a datum stored in a non-volatile memory cell is kept almost indefinitely independently from the supply voltage of the circuit in which the memory cell is implanted.

FIG. 1A shows an embodiment of a volatile memory cell VCELL. The memory cell comprises two inverting gates I1, I2 arranged in closed loop, a writing switch SW and an erase switch SE allowing a datum DTv equal to 1 or to 0 to be stored in the cell. The datum DTv is memorized by the memory cell as long as the inverting gates receive a voltage Vcc, and is erased when the voltage Vcc disappears.

FIG. 1B shows an embodiment of a non-volatile memory cell NVCELL. The cell comprises a floating gate transistor FGT and a read circuit RDCT electrically powered by a voltage Vcc. The memory cell is written by injecting electric charges into the floating gate of the transistor, and is erased by extracting electric charges from the floating gate. The conducting or non-conducting state of the transistor FGT, which depends on the quantity of electric charges trapped in the floating gate, is detected by the read circuit RDCT whose output supplies a datum DTnv. If the supply voltage Vcc disappears, the datum can no longer be read but the state of the memory cell remains the same. The datum DTnv can therefore be read again when the supply voltage reappears.

BRIEF SUMMARY

One embodiment of the invention relates to a memory cell PVCELL schematically shown in FIG. 2, which does not belong to any of the above categories. The memory cell PVCELL is electrically powered by a voltage Vcc and memorizes a datum Fp whose value can be controlled by means of a write signal SET and of an erase signal RESET. This memory cell has the following features:

when the datum is written, it is automatically erased at the end of a period of time Tp called "retention time", which is independent from the voltage Vcc and the erase signal RESET, if the supply voltage Vcc disappears and reappears before the retention time Tp has expired, the datum Fp has, when the voltage Vcc reappears, the same value that it had before the voltage Vcc had disappeared.

This memory cell is therefore called "persistent" and "volatile", on the one hand because it has a retention time not equal to zero during which it does not lose the datum it contains, even if the voltage Vcc disappears, and, on the other hand, because the datum it contains disappears when the retention time has expired.

This memory cell is susceptible to several applications, in particular for executing a process requiring that an electronic circuit memorize a datum playing a part in the process control, and keep this datum during a time for the completion of the process, including if its supply voltage disappears and reappears during the execution of the process.

In these applications, the retention time wanted is short, about a few milliseconds to some hundreds of seconds according to the process specifications, and substantially corresponds to the time of execution of the process.

Thus, one embodiment of the invention provides a structure of a persistent volatile memory cell which has a short retention time but independent from a supply voltage.

A more particular embodiment of the invention provides a structure of a persistent volatile memory cell which is simple and of small overall dimensions, and which can be incorporated in a small integrated circuit, in particular an integrated circuit implanted onto a semiconductor chip whose surface is inferior to a square millimeter.

One embodiment of the invention provides a persistent volatile memory cell, for memorizing a binary datum during a retention time independent from a supply voltage of the memory cell, comprising: a capacitive memory point supplying a persistent voltage and comprising a leakage resistance for having a discharge time, a switch for triggering the charge of the memory point when a write signal has an active value, a switch for triggering the discharge of the memory point when an erase signal has an active value, and a sense-amplifier circuit comprising an input receiving the persistent voltage and setting the binary datum value according to the value of the persistent voltage.

According to one embodiment, the sense-amplifier circuit has a switching threshold, the binary datum has a written value when the persistent voltage is superior to the switching threshold and an erased value when the persistent voltage is inferior to the switching threshold, and the discharge time of the memory point defines the retention time of the binary datum in relation with the switching threshold.

According to one embodiment, the discharge time of the memory point and the retention time of the binary datum are of about a few milliseconds to some hundreds of seconds.

According to one embodiment, the sense-amplifier circuit comprises a switching transistor having a control terminal forming the input of the sense-amplifier circuit and having a threshold voltage forming a switching threshold of the sense-amplifier circuit.

According to one embodiment, the switching transistor is a native MOS transistor with a low threshold voltage.

According to one embodiment, the sense-amplifier circuit comprises an inverter input stage comprising the switching transistor, and an inverter output stage whose input is connected to a node of the inverter stage.

According to one embodiment, the sense-amplifier circuit comprises a switch driven by the erase signal and arranged to impose an electrical potential on a node of the sense-amplifier circuit when the erase signal has the active value, so that the binary datum is forced to the erased value.

According to one embodiment, the switch, to trigger the discharge of the memory point, is driven by a feedback signal taken from the sense-amplifier circuit.

According to one embodiment, the memory point comprises a capacitance in parallel with a resistor.

According to one embodiment, the resistance of the memory point is a parasitic resistance of a MOS transistor.

According to one embodiment, the resistance of the memory point is a parasitic resistance of a MOS transistor forming the switch for triggering the discharge of the memory point.

According to one embodiment, the capacitance of the memory point is a gate stray capacitance of a MOS transistor.

According to one embodiment, the capacitance of the memory point is the gate stray capacitance of a MOS transistor of the sense-amplifier circuit receiving the persistent voltage on its gate terminal.

One embodiment of the invention also relates to an integrated circuit comprising at least one memory cell according to the invention.

One embodiment of the invention also relates to a contactless integrated circuit electrically powered by a continuous voltage generated from alternating signals supplied by an antenna circuit when the integrated circuit is in the presence of an activation field, the integrated circuit comprising at least one memory cell according to the invention, to memorize a flag during the retention time even if the continuous voltage disappears.

According to one embodiment, the integrated circuit comprises a control unit for writing the flag in the memory cell after the integrated circuit was identified during an inventory procedure, and for no longer responding to an inventory command as long as the flag is written in the memory cell.

BRIEF DESCRIPTION OF THE SEVERAL VIEWS OF THE DRAWINGS

These and other advantages and features of the present invention will be presented in greater detail in the following description of embodiments of a memory cell according to the invention, in relation to, but not limited by the following figures.

DETAILED DESCRIPTION

Figure 1A:
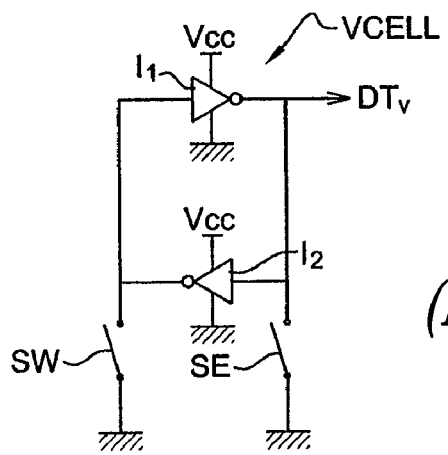
FIGS. 1A and 1B previously described schematically show standard memory cells.
Figure 1B:
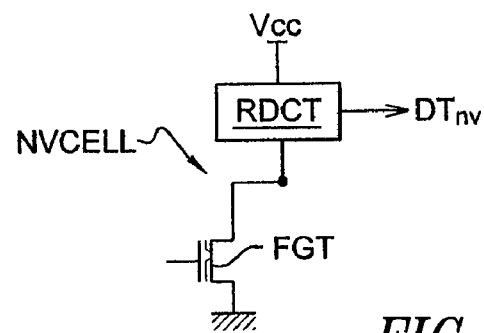
Figure 2:
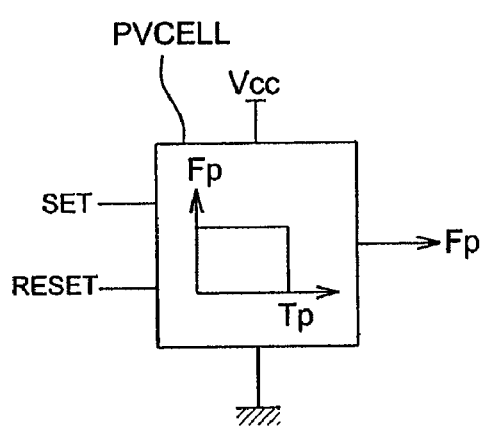
FIG. 2 previously described schematically shows a memory cell that the invention intends to embody.
Figure 3:
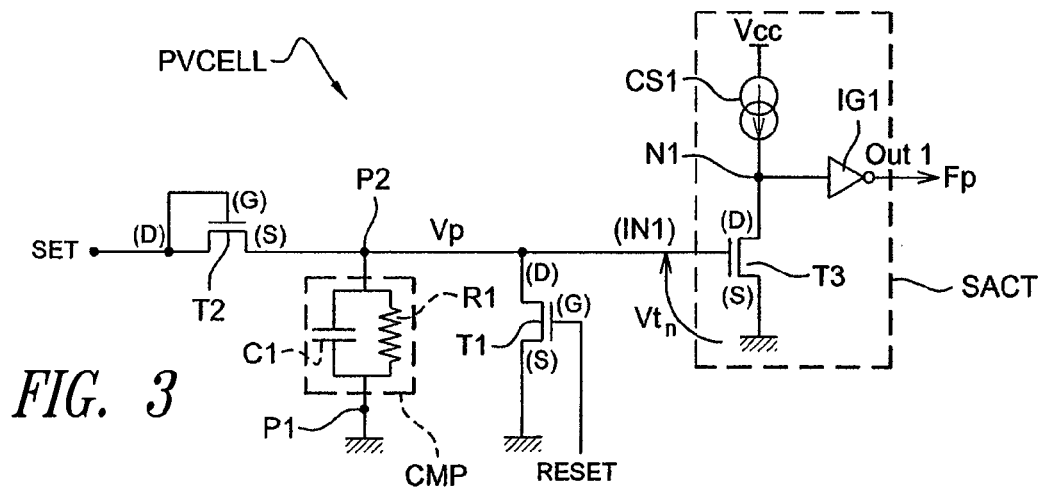
FIG. 3 shows the structure of a memory cell according to one embodiment of the invention.

FIG. 3 shows the global structure of a memory cell PVCELL according to the invention, provided for memorizing a datum, here a bit Fp, during a retention time Tp. The memory cell is electrically powered by a voltage Vcc and receives a write signal SET and an erase signal RESET. The bit Fp, delivered by an output OUT1 of the memory cell, can have a "written" value and an "erased" value. By convention, the written value is the logic value "1" and the erased value is the logic value "0". Still by convention, the active value of the signal SET is the logic value "1" and the active value of the signal RESET is also the logic value "1". Finally, the logic value "1" corresponds here to the voltage Vcc and the logic value "0" corresponds to the ground potential.

The memory cell PVCELL as shown comprises four main elements:

a capacitive memory point CMP which supplies a voltage Vp, a switch T1 for triggering the discharge of the memory point CMP when the erase signal RESET is put to 1 (active value), and a switch T2 for triggering the charge of the memory point when the write signal SET is put to 1 (active value), and a sense-amplifier circuit SACT for setting the value of the bit Fp according to the value of the persistent voltage Vp.

The memory point CMP comprises a capacitance C1 in parallel with a resistor R1, and has a first terminal P1 connected to the ground and a second terminal P2 connected to the input IN1 of the circuit SACT and supplying the voltage Vp. Those skilled in the art will note that the term "capacitance" is preferred here to the term "capacitor" because, as it will be seen below, the capacitance C1 can be an intrinsic capacitance of electronic component not requiring the construction of capacitor armatures to be used as an element of the memory point.

The switch T1 is here an NMOS transistor having a source terminal S connected to the ground, a drain terminal D connected to the terminal P2 of the memory point, and a gate terminal receiving the signal RESET.

The switch T2 is also an NMOS transistor and is arranged to apply the voltage Vcc to the terminal P2 of the memory point when the signal SET is equal to 1. As shown, the transistor T2 has its source terminal S connected to the terminal P2 of the memory point, its gate terminal G connected to its drain terminal D to which the signal SET is applied. This transistor-diode arrangement of the transistor T2 enables the voltage Vcc to flow when the signal SET is equal to 1 (1=Vcc).

When the signal SET is equal to 1, the terminal P2 of the memory point receives the voltage Vcc and the capacitance C1 charges by accumulating electric charges, until the voltage Vp is equal to the voltage Vcc (ignoring the voltage drop at the terminals of the transistor T2).

When the signal SET goes to 0 and the signal RESET remains 0, the capacitance C1 discharges slowly through the resistor R1, which thus forms a leakage resistance of the memory point. The voltage Vp progressively decreases and tends to the potential 0, according to a discharge time which is determined by the constant RC of the memory point.

If the signal RESET is put to 1 before the retention time Tp has expired, the switch T1 becomes conducting and the terminals P1, P2 of the memory point CMP are short-circuited.

The capacitance C1 discharges very fast through the transistor T1 and the voltage Vp becomes equal to zero nearly instantly.

The variations of the voltage Vp are detected by the circuit SACT, which receives the voltage Vp on an input IN1 and supplies the bit Fp to the output OUT1 of the memory cell. The circuit SACT comprises here an inverter input stage, comprising a current source CS in series with a transistor T3 of the NMOS type, and an inverter output stage which supplies the bit Fp. In the input stage, the current source CS has an input biased by the voltage Vcc and an output connected to the drain terminal D of the transistor T3, whose source terminal S is connected to the ground. The gate terminal G of the transistor T3 forms the input IN1 of the circuit SACT and thus receives the voltage Vp. The output stage is here an inverting gate IG1 having its input connected to a node N1 of the input stage, here the node linking the output of the current generator CS to the drain terminal D of the transistor T3.

The circuit SACT has a trigger threshold inferior to the voltage Vcc, which is here equal to the threshold voltage Vtn of the input transistor T3. This threshold is for example equal to 0.2 V and the voltage Vcc equal to 1.8 V. Thus, when the signal SET is put to 1 and that the voltage Vp is brought to the voltage Vcc, thus exceeding the threshold Vtn, the transistor T3 becomes conducting. The current source CS imposes on the input stage a low current in relation to the conductance of the transistor T3, so that the drain D voltage of the transistor T3, that is the voltage of the node N1, decreases to a value lower than a trigger threshold of the gate IG1. The gate IG1 thus has a "0" on its input and the bit Fp goes to 1.

When the voltage Vp becomes lower than the threshold Vtn, the transistor T3 blocks and the node N1 increases to the potential Vcc thanks to the current supplied by the source CS. The gate IG1 changes state and the bit Fp goes to 0 (erased value).

Thus, in accordance with the aims of the invention, the datum Fp is erased in one or the other following cases:

when the retention time Tp has expired, that is when the capacitance C1 is sufficiently discharged for the voltage Vp to be lower than the threshold Vtn, or when the signal RESET is put to 1 before the retention time Tp has expired (otherwise, the datum is already equal to 0).

The retention time Tp is here equal to the time between the instant when the voltage Vp is equal to Vcc and the instant when the voltage Vp becomes lower than the threshold Vtn. In order to maximize this time for a given RC time constant, the transistor T3 is preferably a native transistor (without doping of its channel region) with a low threshold voltage Vtn.

Figure 4:
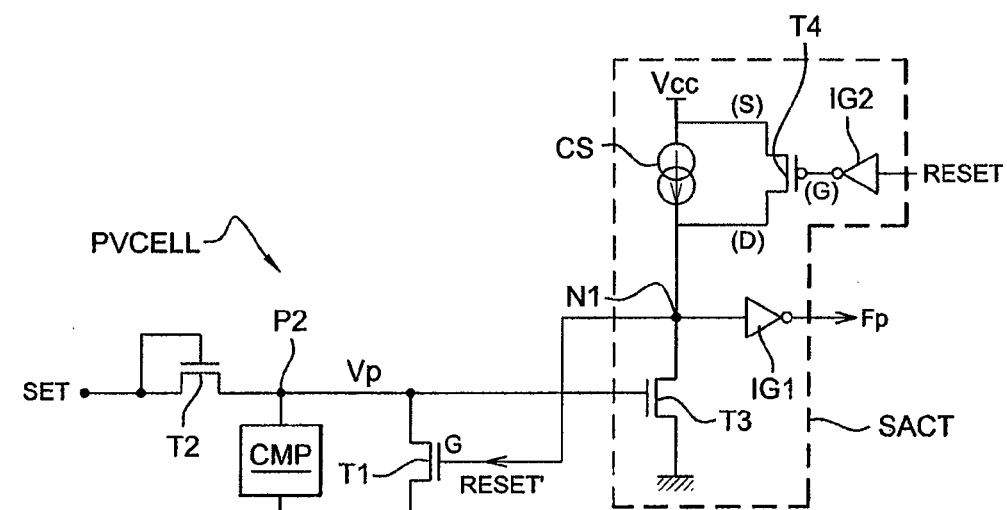
FIG. 4 shows an embodiment of the memory cell of FIG. 3.

In FIG. 4, the structure of the memory cell is configured to have a short erase time when the signal RESET is put to 1. To that purpose, a transistor T4 of the PMOS type is arranged in parallel with the current source CS, its source terminal S receiving the voltage Vcc and its drain terminal D being connected to the node N1. The gate terminal G of the transistor T4 is driven by the output of an inverting gate IG2 which receives the signal RESET.

Thus, when the signal RESET is put to 1, the output of the gate IG2 goes to 0, the PMOS transistor T4 becomes conducting and short-circuits the current generator CS by nearly instantly imposing the voltage Vcc on the node N1, so that the datum Fp immediately goes to 0.

In addition, in FIG. 4, the gate terminal G of the transistor T1 is driven by a feedback signal RESET' which is taken from the node N1 of the circuit SACT. Thus, when the memory cell is forced to 0 by means of the signal RESET and that the node N1 increases to the voltage Vcc, the signal RESET' copies out the signal RESET and the transistor T1 becomes conducting, thus discharging the memory point. The feedback effect occurs when the capacitive memory point naturally discharges, without the intervention of the signal RESET: when the voltage Vp reaches the threshold Vt and that the transistor T2 starts blocking, the voltage of the node N1 increases to Vcc and renders the transistor T1 conducting, which accelerates the discharge of the capacitive memory point and makes it possible to obtain a clear switch of the memory cell.

Figure 5:
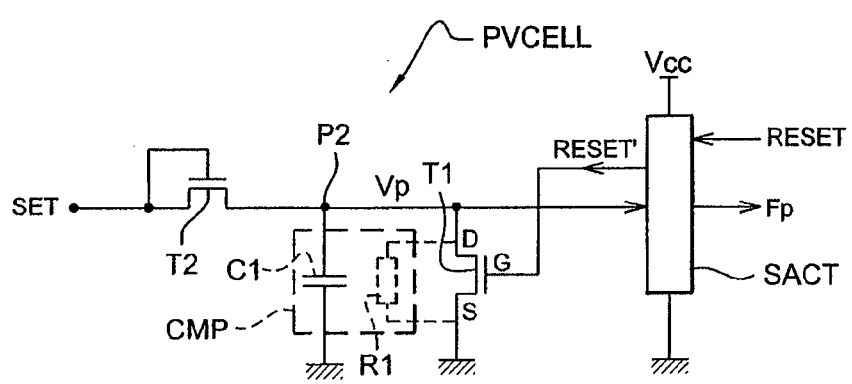
FIG. 5 shows another embodiment of the memory cell of FIG. 3.
Figure 6:
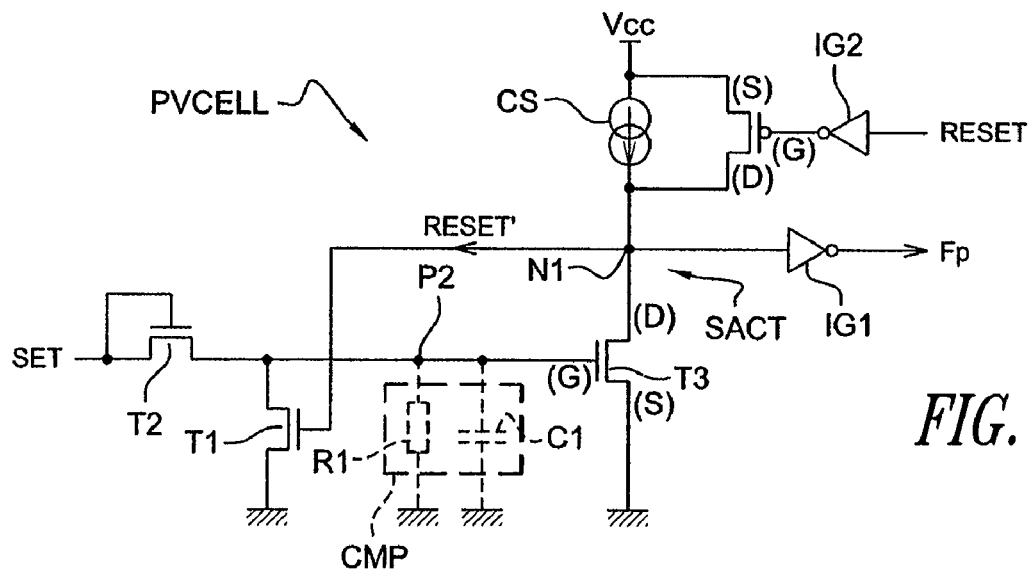
FIG. 6 shows another embodiment of the memory cell of FIG. 3.

FIGS. 5 and 6 show two aspects of the invention enabling the overall dimensions of the memory cell PVCELL to be considerably reduced, in terms of surface of semiconductor occupied.

In FIG. 5, the resistor R1 of the memory point CMP is advantageously the drain-source intrinsic resistance (RD-Soff) of the transistor T1 in the non-conducting state. This resistor has a high value, usually several hundreds or even several thousands Giga ohms ($10^9 \Omega$). Given that the retention time Tp wanted by the invention must be about a few milliseconds to some hundreds seconds (according to the specifications of the process requiring the use of the datum Fp), the use of this parasitic resistance for fixing the RC time constant of the memory point is advantageous on several accounts. On the one hand, it is not necessary to implant a specific resistor onto a semiconductor substrate, and on the other hand, the high value of this resistor is such that the capacitance C1 can have a low value, and consequently a small surface.

FIG. 6 shows a preferred embodiment of the memory cell PVCELL which implements the aspects of the invention described in relation with FIGS. 4 and 5. Moreover, here, the capacitance C1 of the memory point is advantageously the gate-source stray capacitance of the transistor T3. Thus, the memory point CMP is only formed by intrinsic elements C1, R1 (indicated by a dotted line for that reason) which occupy as such a semiconductor surface equal to zero, in addition to the surface occupied by the transistors T1 and T3.

By way of numerical illustration, by dimensioning the transistor T3 so that it has a gate-source capacitance of a few picofarads, for example 10 pF ($10 \; 10^{-12}$ F), and by dimensioning the transistor T1 so that it has a drain-source resistance of $10^{12} \Omega$, the memory point has a time constant of about 10 seconds.

Figure 7:
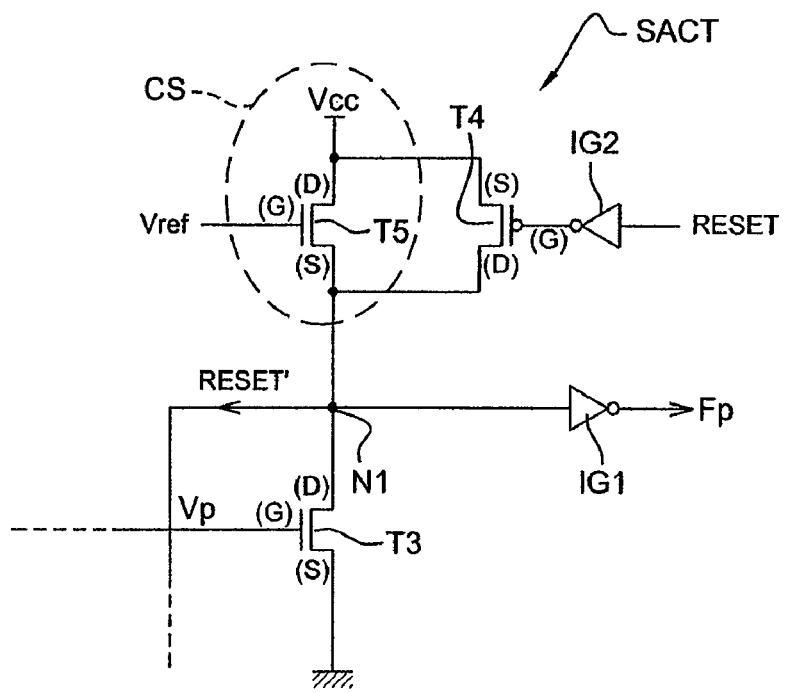
FIG. 7 shows an embodiment of a current generator schematically shown in FIGS. 3 to 6, FIGS. 8A to 8D are chronograms of electrical signals illustrating the operation of the memory cell according of FIG. 3.

An embodiment of the current source CS is shown in FIG. 7. The current source is formed by an NMOS transistor T5 having its source terminal S connected to the drain terminal D of the transistor T3 (node N1), its drain terminal D biased by the voltage Vcc and its gate terminal biased by a reference voltage Vref. The voltage Vref is for example generated by means of a control stage in current mirror configuration (not shown) or by means of a bandgap voltage generator.

It will be clear to those skilled in the art that the constituent elements of the memory cell are susceptible to several embodiments and improvements, particularly the structure of the memory point CMP and the structure of the sense-amplifier circuit, which have been designed here to be of simple structure and comprise a minimum of components. In addition, the memory point CMP can be charged to the voltage Vcc in various other ways, to respond to the signal SET going to 1. The signal SET can be for example applied to the gate terminal G of the transistor T2 and the voltage Vcc be continuously applied to the drain terminal D of this transistor. The charge of the memory point can also be performed by means of a specific voltage different from the voltage Vcc.

FIGS. 8A to 8D illustrate the operation of the memory cell according to the invention. FIG. 8A shows variations of the voltage Vcc, FIG. 8B shows variations of the write signal SET and FIG. 8C shows variations of the erase signal RESET.

In the example shown, the voltage Vcc disappears at an instant t6, reappears at an instant t7, disappears again at an instant t10 and reappears at an instant t11. The signal SET is transiently put to 1 at instants t1, t3, t5, t9 and the signal RESET is transiently put to 1 at an instant t2.

FIG. 8D shows the aspect of the bit Fp supplied by the memory cell. The following variations are observed:

1) the bit Fp goes to 1 at the instant t1 (SET=1) and goes to 0 at the instant t2 because the signal RESET is put to 1 before the retention time Tp has expired (t2−t1<Tp), 2) the bit Fp goes to 1 at the instant t3 (SET=1) and goes to 0 at the instant t4 when the retention time Tp has expired (t4−t3=Tp), 3) the bit Fp goes to 1 at the instant t5 (SET=1), then goes to 0 at the instant t6 because the voltage Vcc disappears (the sense-amplifier circuit SACT no longer operates), then goes to 1 at the instant t7 when the voltage Vcc reappears, because the retention time Tp has not expired, then goes to 0 at an instant t8 when the retention time has expired (t8−t5=Tp), 4) the bit Fp goes to 1 at the instant t9 (SET=1) then goes to 0 at the instant t10 because the voltage Vcc disappears, and remains 0 at the instant t11, when the voltage Vcc reappears, because the retention time Tp has expired (t11−t9>Tp), the capacitive memory point being discharged below the threshold Vtn.

As indicated above, the memory cell according to one embodiment of the invention is susceptible to several applications and particularly the control of a process during which the supply voltage Vcc of the memory cell can temporarily disappears, as it has just been described.

Figure 9:
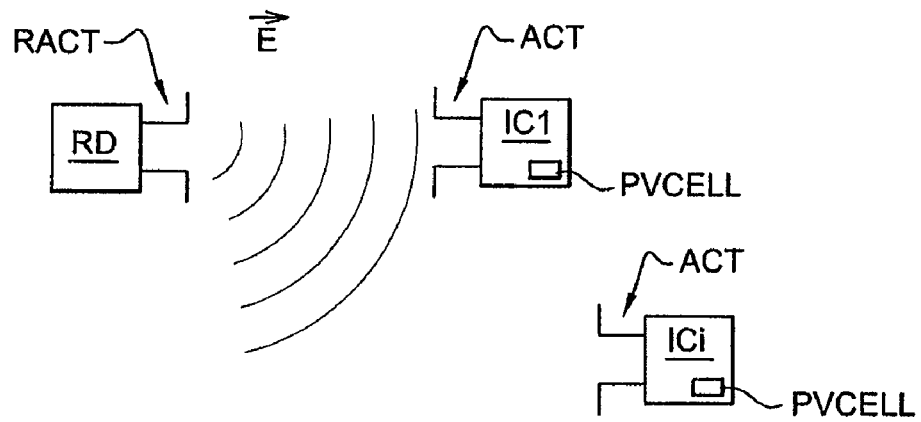
FIG. 9 shows an application of one embodiment of the invention to the execution of an inventory process concerning contactless integrated circuits, and FIG. 10 schematically shows the architecture of a contactless integrated circuit comprising a memory cell according to one embodiment of the invention.
Figure 9:
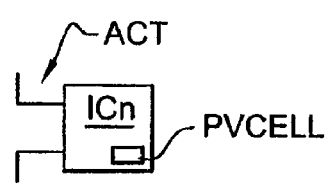

FIG. 9 shows an application of one embodiment of the invention to the execution of an inventory process concerning a plurality of contactless integrated circuits IC (IC1, . . . ICi, . . . ICn). The inventory is performed by a reader RD (contactless integrated circuit reader) equipped with an antenna circuit RACT by means of which the reader emits an activation field, here an electric field E. The activation field is used to electrically power the integrated circuits, to send commands to the integrated circuits and to receive responses emitted by the integrated circuits.

Each integrated circuit IC is equipped with an antenna circuit ACT and is electrically powered from antenna signals induced by the electric field E. Each integrated circuit IC comprises at least one memory cell PVCELL according to one embodiment of the invention. The bit Fp memorized by the cell PVCELL is used as inventory flag.

The inventory is triggered when the reader RD sends an inventory command to all the integrated circuits present in the activation field. In response to the inventory command, each integrated circuit responds by sending an identification message comprising a user identification (for example a serial number) while respecting an anticollision protocol enabling collisions between identification messages to be avoided, if not to be limited. For example, each integrated circuit chooses a random position of response on a timescale of response whose range is determined by the inventory command.

In order to allow the complete inventory of all the integrated circuits present in the activation field while limiting the number of collisions, it is desired that an identified integrated circuit does not respond to a new inventory command, that the reader can be led to emit if collisions between responses do not allow it to identify all the integrated circuits.

Thus, when an integrated circuit IC knows it has been inventoried, that is when it has received from the reader RD a receive acknowledgement confirming its identification message has been properly read, it puts its inventory flag Fp to 1 and keeps it during the retention time Tp, the latter being chosen long enough to allow the inventory process to be closed. As long as the flag is at 1, the integrated circuit does not respond to new inventory commands. When the time that passed between the instant when an integrated circuit is inventoried and the instant when it receives a new inventory command is superior to the retention time of the flag Fp, the integrated circuit responds to the new inventory command because the flag Fp has become equal to 0 again.

However, in this application, the distance between the integrated circuits IC and the reader RD is not always mastered, each integrated circuit being attached to a mobile object (electronic tag, chip card, badge . . . ) which is susceptible to being brought out of the activation field and then to being brought back into the activation field. Thus, an integrated circuit can temporarily lose its supply voltage and find it back before the inventory process ends.

Thanks to the memory cell PVCELL according to one embodiment of the invention, an integrated circuit which has come out of the activation field and is put back into the activation field before the inventory process ends, is able to know, when it "wakes up" (when its supply voltage reappears), that it has been recently inventoried, so that it does not respond to a new inventory command.

Figure 10:
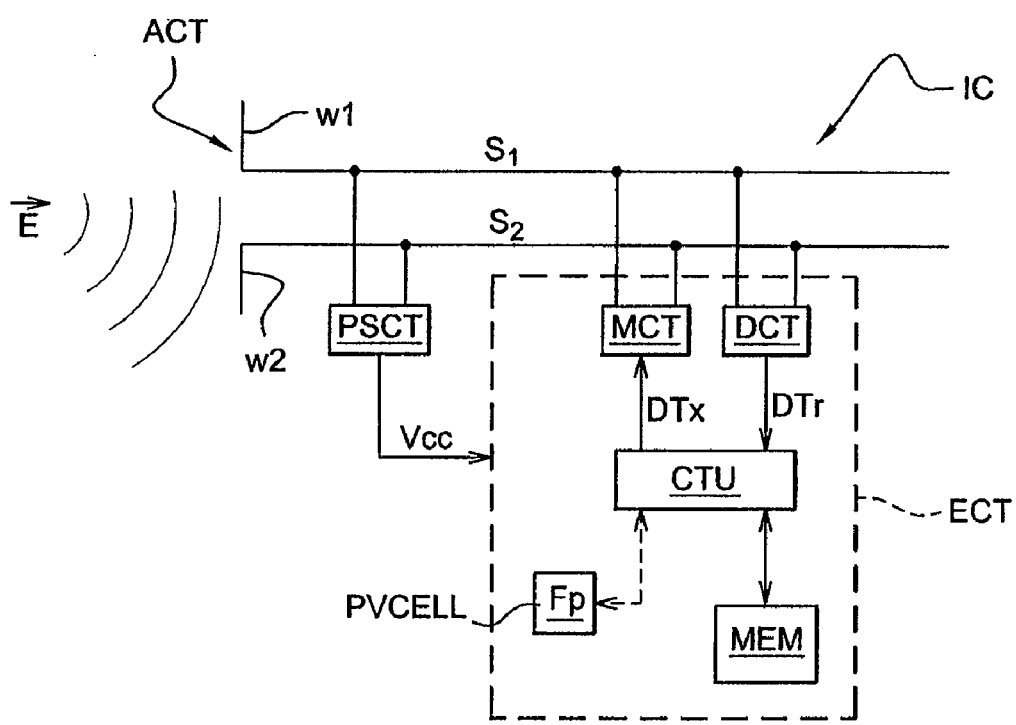

FIG. 10 shows an embodiment of an integrated circuit IC provided for this application. The integrated circuit comprises:

1) an antenna circuit ACT comprising conductors W1, W2, 2) a power supply circuit PSCT supplying a supply voltage Vcc, and 3) an electronic circuit ECT electrically powered by the voltage Vcc, implementing transponder functionalities.

The electronic circuit ECT comprises a modulation circuit MCT and a demodulation circuit DCT linked to the antenna circuit ACT, a control unit CTU, a non-volatile memory MEM, for example an EEPROM memory, and a persistent volatile memory cell PVCELL according to one embodiment of the invention (several cells can also be provided for forming a register according to one embodiment of the invention).

In presence of the electric field E emitted by the reader RD (FIG. 9), antenna signals S1, S2 appear in the conductors W1, W2 and activate the power supply circuit PSCT. The latter then supplies the voltage Vcc and the integrated circuit switches from the dead state to the activated state.

The reader RD sends data DTr to the integrated circuit by modulating the electric field E, for example by modulating the amplitude of the electric field. The amplitude modulation affects the antenna signals S1, S2. The circuit DCT demodulates the signals S1, S2 and supplies to the unit CTU the data DTr which are conveyed by these signals. On its side, the control unit CTU sends data DTx to the reader by means of the circuit MCT, which modulates the impedance of the antenna circuit ACT according to these data. This impedance modulation affects the antenna circuit of the reader RD, and the latter deduces from it the data DTx.

Thanks to these various elements, the unit CTU is able to receive and execute commands sent by the reader RD, in particular commands for reading or writing in the memory MEM, as well as the command INVENTORY. More particularly, when the unit CTU has responded to an inventory command and that it receives a receive acknowledgement from the reader, the unit CTU puts the flag Fp to 1 and does no longer respond to the inventory command as long as the flag Fp is equal to 1.

The architecture of the integrated circuit IC, known in itself from those skilled in the art, will not be described in further detail. The integrated circuit IC can for example be constructed in accordance with the industrial specifications EPCTM-GEN2 ("*Radio-Frequency Identity Protocols Class*-1 *Generation*-2-*UHF RFID Protocol for Communications at* 860 MHz-960 MHz") in the course of standardization.

The contactless integrated circuits of the type of the one which has just been described are usually called RFID integrated circuits (Radio Frequency Identification) and make it possible to construct various electronic portable objects operating without contact, like electronic tags or contactless chip cards, in particular electronic wallets, access control cards, transport cards . . . .

The invention applies to any type of passive contactless integrated circuit using an activation field to produce a supply voltage. This activation field can be an electric field, as described above, but it can also be a magnetic field. Thus, the invention also applies to contactless integrated circuits comprising an antenna coil, in particular circuits called "PICC" ("Proximity Inductive Coupling Circuits") compliant with one of the standards ISO/IEC 14443A/B, ISO/IEC 13693.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A persistent volatile memory cell, for memorizing a binary datum during a retention time independent from a supply voltage of the memory cell, comprising:
   a capacitive memory point structured to supply a persistent voltage and comprising a leakage resistance for having a discharge time,
   a first switch structured to trigger charging of the memory point when a writing signal has an active value,
   a sense-amplifier circuit comprising an input coupled to receive the persistent voltage, the sense-amplifier circuit being structured to set a value of the binary datum according to a value of the persistent voltage, and
   a second switch structured to trigger discharging of the memory point when an erase signal has an active value, the second switch being structured to be driven by a feedback signal taken from the sense-amplifier circuit.

2. The memory cell according to claim 1, wherein:
   the sense-amplifier circuit has a switching threshold,
   the value of the binary datum is a written value when the persistent voltage is superior to the switching threshold and an erased value when the persistent voltage is inferior to the switching threshold, and
   the discharge time of the memory point defines the retention time of the binary datum in relation with the switching threshold.

3. The memory cell according to claim 1, wherein the discharge time of the memory point and the retention time of the binary datum are in a range of about a few milliseconds to some hundreds of seconds.

4. The memory cell according to claim 1, wherein the sense-amplifier circuit comprises a switching transistor having a control terminal forming the input of the sense-amplifier circuit and having a threshold voltage forming a switching threshold of the sense-amplifier circuit.

5. The memory cell according to claim 4, wherein the switching transistor is a native MOS transistor with a low threshold voltage.

6. The memory cell according to claim 4, wherein the sense-amplifier circuit comprises an inverter input stage including the switching transistor, and an inverter output stage having an input connected to a node of the inverter input stage.

7. The memory cell according to claim 1, wherein the sense-amplifier circuit comprises a switch coupled to be driven by the erase signal and arranged to impose an electrical potential on a node of the sense-amplifier circuit when the erase signal has the active value, so that the binary datum is forced to an erased value.

8. The memory cell according to claim 1, wherein the memory point comprises a capacitance in parallel with a resistance.

9. The memory cell according to claim 8, wherein the resistance of the memory point is a parasitic resistance of a MOS transistor.

10. The memory cell according to claim 8, wherein the resistance of the memory point is a parasitic resistance of a MOS transistor forming the second switch.

11. The memory cell according to claim 8, wherein the capacitance of the memory point is a gate stray capacitance of a MOS transistor.

12. The memory cell according to claim 8, wherein the capacitance of the memory point is a gate stray capacitance of a MOS transistor of the sense-amplifier circuit, the MOS transistor having a gate terminal coupled to receive the persistent voltage.

13. An integrated circuit, comprising:
   a persistent volatile memory cell, for memorizing a binary datum during a retention time independent from a supply voltage of the memory cell, the memory cell including:
   a capacitive memory point structured to supply a persistent voltage and comprising a leakage resistance for having a discharge time,
   a first switch structured to trigger charging of the memory point when a writing signal has an active value,
   a sense-amplifier circuit comprising an input coupled to receive the persistent voltage, the sense-amplifier circuit being structured to set a value of the binary datum according to a value of the persistent voltage, and
   a second switch structured to trigger discharging of the memory point when an erase signal has an active value, the second switch being structured to be driven by a feedback signal taken from the sense-amplifier circuit.

14. The integrated circuit according to claim 13, wherein:
   the sense-amplifier circuit has a switching threshold,
   the value of the binary datum is a written value when the persistent voltage is superior to the switching threshold and an erased value when the persistent voltage is inferior to the switching threshold, and
   the discharge time of the memory point defines the retention time of the binary datum in relation with the switching threshold.

15. The integrated circuit according to claim 13, wherein the sense-amplifier circuit comprises a switching transistor having a control terminal forming the input of the sense-amplifier circuit and having a threshold voltage forming a switching threshold of the sense-amplifier circuit.

16. The integrated circuit according to claim 15, wherein the sense-amplifier circuit comprises an inverter input stage including the switching transistor, and an inverter output stage having an input connected to a node of the inverter input stage.

17. The integrated circuit according to claim 13, wherein the sense-amplifier circuit comprises a switch coupled to be driven by the erase signal and arranged to impose an electrical potential on a node of the sense-amplifier circuit when the erase signal has the active value, so that the binary datum is forced to an erased value.

18. The integrated circuit according to claim 13, further comprising a supply circuit structured to supply the supply voltage to the memory cell.

19. A contactless integrated circuit, comprising:
- an antenna circuit structured to supply alternating signals when the integrated circuit is in presence of an activation field;
- a supply circuit structure to generate a continuous voltage from the alternating signals supplied by the antenna circuit; and
- a persistent volatile memory cell to memorize a flag during a retention time even if the continuous voltage disappears, the memory cell including:
  - a capacitive memory point structured to supply a persistent voltage and comprising a leakage resistance for having a discharge time,
  - a first switch structured to trigger charging of the memory point when a writing signal has an active value,
  - a sense-amplifier circuit comprising an input coupled to receive the persistent voltage, the sense-amplifier circuit being structured to set a value of the binary datum according to a value of the persistent voltage, and
  - a second switch structured to trigger discharging of the memory point when an erase signal has an active value, the second switch being structured to be driven by a feedback signal taken from the sense-amplifier circuit.

20. The contactless integrated circuit according to claim 19, comprising a control unit for writing the flag in the memory cell after the integrated circuit is identified during an inventory procedure, and for no longer responding to an inventory command as long as the flag is written in the memory cell.

21. The contactless integrated circuit according to claim 19, wherein:
- the sense-amplifier circuit has a switching threshold,
- the value of the binary datum is a written value when the persistent voltage is superior to the switching threshold and an erased value when the persistent voltage is inferior to the switching threshold, and
- the discharge time of the memory point defines the retention time of the binary datum in relation with the switching threshold.

22. The contactless integrated circuit according to claim 19, wherein the sense-amplifier circuit comprises a switching transistor having a control terminal forming the input of the sense-amplifier circuit and having a threshold voltage forming a switching threshold of the sense-amplifier circuit.

23. The contactless integrated circuit according to claim 22, wherein the sense-amplifier circuit comprises an inverter input stage including the switching transistor, and an inverter output stage having an input connected to a node of the inverter input stage.

24. The contactless integrated circuit according to claim 19, wherein the sense-amplifier circuit comprises a switch coupled to be driven by the erase signal and arranged to impose an electrical potential on a node of the sense-amplifier circuit when the erase signal has the active value, so that the binary datum is forced to an erased value.

* * * * *